United States Patent
Aydogan

(10) Patent No.: US 8,921,035 B2
(45) Date of Patent: Dec. 30, 2014

(54) POLYMER WASHOUT SOLVENT, AND THE USE THEREOF FOR DEVELOPING A FLEXOGRAPHIC PRINTING PLATE

(75) Inventor: Figen Aydogan, Zwaluwstraat (NL)

(73) Assignee: Flexoclean Engineering B.V., Raamsdonksveer (NL)

( * ) Notice: Subject to any disclaimer, the term of this patent is extended or adjusted under 35 U.S.C. 154(b) by 0 days.

(21) Appl. No.: 13/378,328

(22) PCT Filed: Jun. 8, 2010

(86) PCT No.: PCT/EP2010/058008
§ 371 (c)(1),
(2), (4) Date: Jul. 12, 2012

(87) PCT Pub. No.: WO2011/042225
PCT Pub. Date: Apr. 14, 2011

(65) Prior Publication Data
US 2012/0196231 A1    Aug. 2, 2012

(30) Foreign Application Priority Data
Oct. 9, 2009   (EP) ..................... 09172718

(51) Int. Cl.
G03F 7/00   (2006.01)
G03F 7/26   (2006.01)
G03C 5/18   (2006.01)
G03C 5/26   (2006.01)
G03F 7/32   (2006.01)

(52) U.S. Cl.
CPC ...................... *G03F 7/325* (2013.01)
USPC ......................... 430/434; 430/306

(58) Field of Classification Search
CPC ............ C07C 1/00; G03F 7/26; G03F 7/32; G03C 5/30
USPC ........... 430/300–309, 331, 454, 401, 437; 101/453, 463.1
See application file for complete search history.

(56) References Cited

U.S. PATENT DOCUMENTS

| | | | |
|---|---|---|---|
| 4,780,391 A * | 10/1988 | Hiraishi et al. | 430/138 |
| 5,354,645 A | 10/1994 | Schober et al. | |
| 2006/0040218 A1 | 2/2006 | Wyatt et al. | |
| 2010/0068651 A1 * | 3/2010 | Bradford | 430/306 |
| 2011/0183260 A1 * | 7/2011 | Fohrenkamm et al. | 430/270.1 |

FOREIGN PATENT DOCUMENTS

| | | |
|---|---|---|
| CN | 1599883 | 3/2005 |
| EP | 0355789 A2 * | 8/1989 |
| EP | 0355789 | 2/1990 |
| EP | 1085003 | 3/2001 |
| JP | 57108851 | 7/1982 |
| WO | 02/061506 | 8/2002 |
| WO | 03/046666 | 6/2003 |

OTHER PUBLICATIONS

BDH Material Data Sheet: Petroleum Ether (2006) pp. 1-9.*

* cited by examiner

*Primary Examiner* — Chanceity Robinson
(74) *Attorney, Agent, or Firm* — Edward J. Baba; Daniel Stoddard; Bozicevic, Field & Francis LLP

(57) ABSTRACT

A polymer washout solvent for developing a flexographic printing plate comprising: —an ester hydrocarbon component, —an ether hydrocarbon component, —an alcoholic hydrocarbon component. The washout solvent of the invention has less hazardous properties than the known solvents. Use of a polymer washout solvent for developing a flexographic printing plate in a washing step.

10 Claims, No Drawings

POLYMER WASHOUT SOLVENT, AND THE USE THEREOF FOR DEVELOPING A FLEXOGRAPHIC PRINTING PLATE

A polymer washout solvent, and the use thereof for developing a flexographic printing plate.

The present invention relates to a polymer washout solvent and the use thereof for developing a flexographic printing plate.

In the technical field of the invention, flexographic printing plates are flexible, polymeric plates which have a relief corresponding to an image to be printed. The relief is present on top of a basic layer. The production of these printing plates (also referred to as solvent printing plates, or clichés) starts with sheets of soft photopolymerizable material, which can be hardened under influence of light. First the back side of the plate is exposed uniformly to UV/A light to obtain a hardened basic layer. Subsequently the front side of the plate is exposed to UV/A light according to a certain pattern. This is usually done by applying at the front side a mask with openings which is the negative of the pattern to be printed. The light passing through the openings of the mask thus hardens specific regions of the front side of the plate. The not hardened regions can be removed in various ways, to obtain a so called developed flexographic plate. Usually the removal of not hardened polymer is performed by washing the plate in a solvent, a so called polymer washout solvent. During the washing step not hardened polymer is removed, and the remaining hardened regions (i.e. the relief) absorb some solvent so that they swell. Special dryers are used to remove solvent absorbed in the relief, before they are ready for use.

In practice, well-known and widely used are polymer washout solvents such as 'Haku' produced by the company Kluthe, and 'Nylosolv A' produced by the company BASF. Both solvents have in spite of their popularity, drawbacks. Nylosolv A was introduced in 1988 to substitute earlier solvents based on perchloroethylene (a CFC, an environmentally hazardous compound). A major ingredient (25-50 wt %) in Nylosolv A (obtained from Flint Group GmbH) is a heavy fraction of hydrated distillate of mineral oil. Also Haku (obtained from Kluthe) contains such a heavy fraction distillate (50-100 wt %, including aromatics). This component, also referred to as naphta, is classified as hazardous.

Apart from the heavy fraction distillate, Nylosolv A contains cyclohexanol (25-50 wt. %) and m-diisopropyl benzene (10-25 wt %). As second main ingredient Haku contains benzylalcohol (10-25 wt. %). These components are also classified as hazardous.

Another example is Flexosol from the company Biesterveld B.V., which contains heavy fraction distillate and benzylalcohol.

Thus the known solvents are hazardous compositions, and are harmful in the sense that they present a threat to man and environment. For that reason, it is not allowed to keep in stock large amounts of these solvents, unless strict and cost-consuming measures are taken to prevent any accidents. Besides these unwanted properties, the solvents have an unpleasant odor. This unpleasant odor is also transmitted to the printing plates after washing with the solvent, which compromises the quality of the end-product. Furthermore, different sheets of soft photopolymerizable material, require different types of washout solvent to achieve the best washout result.

Apart from these drawbacks, there is a general interest in improving the steps of washing and drying of the flexographic plates, for instance by reducing the time needed for these steps. In addition there is also a general interest in providing a solvent which is easily and economically re-usable. Finally, such washout solvent should be able to achieve a similar result in regard of the appearance and properties of the developed flexographic printing plate, when compared to known solvents.

Accordingly, the objective of the invention is to provide a less hazardous and less harmful polymer washout solvent which achieves at the same time one or more of the above indicated goals.

The objective of the invention is achieved by a polymer washout solvent for developing a flexographic printing plate which comprises:
an ester hydrocarbon component,
an ether hydrocarbon component,
an alcoholic hydrocarbon component.

The washout solvent contains no heavy fraction distillates (i.e. naphta) as used in the known solvents. Instead, three main components are in the solvent which are not classified as hazardous or harmful. The solvent is thus intrinsically less hazardous than the known solvents. Also the bad odor is not present any longer.

Although the industry has been investigating for a long time how to formulate a solvent which does not have the drawbacks of naphta, it did not succeed in providing such solvent.

Furthermore, the solvent—as will be shown below— achieves a reduction of the time needed when washing and drying a flexographic plate. Most surprisingly, the solvent of the invention is only slightly absorbed in hardened regions so that swelling during the washing step is absent or very low. Obviously, this has a positive effect on the subsequent drying time, in that the time needed is reduced. As the solvent is suitable for a wide range of different soft photopolymerizable materials, it is not longer required to keep stocks of different washout solvents, as they can be replaced by the single washout solvent of the invention.

Also, the solvent is a stable mixture, as it showed no precipitation effects during normal shelf life.

The solvent is after use as wash-out solvent, fit for re-use by distilling off used solvent (regeneration), because no major adjustments to the specific ratio of the components in the distilled solvent are needed. Furthermore, because of the relatively low number of components, the solvent is easily adjusted, if needed.

During use, it was found that the solvent can be used for more than 40 washing cycles without the need of regeneration. In contrast, Nylosolv is to be regenerated sooner, as it shows precipitation of particles of washed out polymer. This indicates that the solvent of the invention has a higher solubility value for the polymers to be washed out than known solvents.

Preferably, the solvent of the invention comprises
10-25 wt. % ester hydrocarbon component
50-75 wt. % ether hydrocarbon component, and
10-25 wt. % alcoholic hydrocarbon component.

Particularly effective is a solvent wherein the ester hydrocarbon component comprises a compound chosen from the group of ester compounds of a C1-C5 alkyl, a benzyl or a benzyl derivative and a C1-C5 alkanoate, as well as mixtures of these ester compounds. The C1-O5 groups may be branched or straight hydrocarbons, and preferred are straight hydrocarbons.

Especially preferred for its effectiveness is a solvent wherein the ester hydrocarbon component includes acetate as alkanoate, and preferably benzyl or a benzylderivative.

Preferably, in the polymer washout solvent of the invention, the ether hydrocarbon component comprises a di-ether of an C1-C8 alkane derived from a diol, and two C1-C3 alkoxy groups.

With more preference, in the polymer washout solvent according to the invention, the ether hydrocarbon component comprises a di-ether of an alkane having an internal ether group, and preferably two methoxy groups.
Especially preferred is a di-ether such as dipropylene glycol dimethyl ether.

Furthermore preferred is a solvent wherein the alcoholic hydrocarbon component comprises a compound chosen from the group of C1-C10 alcoholic compounds, as well as mixtures of these alcoholic compounds. The C1-C10 groups may be branched or straight hydrocarbons. Again, such solvents prove to be effective in achieving the goals of the invention.

Preferably, the alcoholic hydrocarbon component comprises a compound chosen from the group of C3-C6 alcoholic compounds or a mixture thereof, a primary alcoholic group is present, and more preferably the hydrocarbon chain is straight. Especially preferred are n-butanol and/or n-pentanol.

Also preferred is a solvent of the invention wherein the alcoholic hydrocarbon component comprises a compound containing a secondary alcoholic group, possibly also containing an ether group.

In particular, in the solvent of the invention, the alcoholic compound is a propanol, preferably propan-2-ol and/or 1-methoxypropan-2-ol.

Advantageously, the washout solvent according to the invention contains additives for improving the odor of the solvent. For example known fragrances are used to mask any unwanted odor from the solvent. In particular, D-Limonene is used as an additive.

In another aspect, the invention relates to the use of a polymer washout solvent according to the invention, for developing a flexographic printing plate in a washing step. As will be shown below, when using the solvent of the invention, the developing of a flexographic printing plate becomes less time consuming, in regard of the washing step, as well as the subsequent drying step.

The Example below shows a polymer washout solvent according to the invention, and its use for developing a flexographic printing plate.

EXAMPLE

A mixture of the following components was prepared:

| Component | Wt % |
| --- | --- |
| dipropylene glycol dimethyl ether | 50-75 |
| Benzyl acetate | 10-25 |
| n-butanol | 10-25 |

The obtained mixture, a washout solvent according to the invention, has a boiling point of 116° C., a flash point of 48° C. and a density of 0.92 kg/liter. The solvent is classified according to ADR for transportation safety as class 3, UN1120, group 3.

The washout solvent was used in a wash-out apparatus (from DuPont company) for developing flexographic printing plates (from Flint company). Regions on the front side of the plate were beforehand selectively photopolymerized under UV light by using a mask.

The time needed for washing off the non-hardened polymer from the plate (2.84 mm thickness), was 400-500 seconds, which is approximately half the time in comparison to a known solvent as Nylosolv A. Virtually no swelling occurred after performing the washing step.

The time needed for the subsequent drying step was 15-30 minutes, which is a reduction by 1.5 to 2 hours compared to using a known solvent.

The used solvent with the washed off non-hardened polymer, was distilled off to recover the solvent. The distilled solvent showed to have a ratio of components similar to the solvent before use, and is thus regenerable without the need of major adjustments to the relative amounts of the components. In contrast, known solvents need major adjustment of the relative amounts of the components, after distilling off after their use. The components have to be added in specific amounts to the distillate in order to obtain a suitable regenerated washout solvent for re-use. According to specific tables the amounts to be added have to be calculated in order to regenerate the solvent correctly.

The invention claimed is:

1. A polymer washout solvent for developing a flexographic printing plate comprising:
   10-25 wt. % of an ester hydrocarbon component comprising benzyl acetate as an alkanoate,
   50-75 wt. % of an ether hydrocarbon component, and
   10-25 wt. % of an alcoholic hydrocarbon component,
   wherein the polymer washout solvent does not include heavy fraction distillates, and wherein no swelling or virtually no swelling of the flexographic printing plate occurs during washing of the flexographic printing plate.

2. A polymer washout solvent according to claim 1, wherein the ether hydrocarbon component comprises a di-ether of an C1-C8 alkane derived from a diol, and two C1-C3 alkoxy groups.

3. A polymer washout solvent according to claim 1, wherein the ether hydrocarbon component comprises a diether of an alkane having an internal ether group.

4. A polymer washout solvent according to claim 1, wherein the alcoholic hydrocarbon component comprises a compound chosen from the group of C3-C6 alcoholic compounds or a mixture thereof, and contains a primary alcoholic group.

5. A polymer washout solvent according to claim 1, wherein the alcoholic hydrocarbon component comprises a compound chosen from the group of n-butanol and n-pentanol or a combination thereof.

6. A polymer washout solvent according to claim 1, wherein the alcoholic hydrocarbon component comprises a compound, wherein an alcoholic moiety of the alcoholic hydrocarbon component is a secondary alcoholic group.

7. A method of developing a flexographic printing plate in a washing step, the method comprising applying the polymer washout solvent according to claim 1 to a flexographic printing plate.

8. A polymer washout solvent according to claim 3, wherein the ether hydrocarbon component comprises two methoxy groups.

9. A polymer washout solvent according to claim 4, wherein the hydrocarbon chain is straight.

10. A polymer washout solvent according to claim 6, wherein the compound comprises an ether group.

* * * * *